(12) United States Patent
Ziberna

(10) Patent No.: US 7,087,835 B2
(45) Date of Patent: Aug. 8, 2006

(54) APPARATUS AND METHOD FOR SHIELDING PRINTED CIRCUIT BOARDS

(75) Inventor: Frank J. Ziberna, Winfield, IL (US)

(73) Assignee: Bi-Link Metal Specialties Inc., Bloomingdale, IL (US)

( * ) Notice: Subject to any disclaimer, the term of this patent is extended or adjusted under 35 U.S.C. 154(b) by 0 days.

(21) Appl. No.: 10/968,689

(22) Filed: Oct. 19, 2004

(65) Prior Publication Data

US 2006/0084289 A1 Apr. 20, 2006

(51) Int. Cl.
*H05K 9/00* (2006.01)

(52) U.S. Cl. .................................. 174/35 R

(58) Field of Classification Search ............ 174/35 R; 361/816, 818; 439/607
See application file for complete search history.

(56) References Cited

U.S. PATENT DOCUMENTS

| 4,218,578 A | 8/1980 | Olschewski et al. |
|---|---|---|
| 4,829,432 A | 5/1989 | Hershberger et al. |
| 4,890,199 A | 12/1989 | Beutler |
| 5,045,973 A | 9/1991 | Saarela et al. |
| 5,150,282 A * | 9/1992 | Tomura et al. ............ 361/818 |
| 5,252,782 A | 10/1993 | Cantrell et al. |
| 5,436,802 A | 7/1995 | Trahan et al. |
| 5,473,111 A | 12/1995 | Hattori et al. |
| 5,508,889 A | 4/1996 | Ii |
| 5,614,694 A | 3/1997 | Gorenz, Jr. et al. |
| 5,633,786 A | 5/1997 | Matuszewski et al. |
| 5,872,332 A | 2/1999 | Verma |
| 6,051,779 A | 4/2000 | Gammon |
| 6,096,413 A | 8/2000 | Kalinoski et al. |
| 6,136,131 A | 10/2000 | Sosnowski |
| 6,169,666 B1 | 1/2001 | Venant |
| 6,175,077 B1 | 1/2001 | Mendolia et al. |
| 6,178,097 B1 | 1/2001 | Hauk, Jr. |
| 6,180,876 B1 | 1/2001 | Holmes |
| 6,269,537 B1 | 8/2001 | Kimura et al. |

(Continued)

FOREIGN PATENT DOCUMENTS

JP 6-29684 * 2/1994

OTHER PUBLICATIONS

BMI, INC., Webpage, Copyright 2003. (5 pages).

*Primary Examiner*—Neil Abrams
(74) *Attorney, Agent, or Firm*—Cook, Alex, McFarron, Manzo, Cummings & Mehler, Ltd.

(57) ABSTRACT

A shielding apparatus for a portion of a printed circuit board is provided comprising a cover for shielding a selected portion of the printed circuit board. The cover includes an edge, wherein a sidewall is molded about the edge of the cover. The sidewall includes a first and second ledge for supporting the edge of the cover. The shielding apparatus is further shown to include an inner wall extending from a first portion of the sidewall to a second portion of the sidewall for defining discrete areas of the printed circuit board being shielded. In this arrangement, the cover may define apertures in the cover along the abutment with the inner wall to improve flow during the insert molding process and provide a mechanical bond between the cover and the inner wall.

12 Claims, 3 Drawing Sheets

U.S. PATENT DOCUMENTS 6,331,349 B1  12/2001  Kalinoski et al.
6,377,472 B1   4/2002  Fan
6,420,649 B1   7/2002  Kahl et al.
6,426,881 B1   7/2002  Kurz
6,501,016 B1  12/2002  Sosnowski
6,515,222 B1   2/2003  Underwood et al.
6,552,261 B1   4/2003  Shlahtichman et al.

* cited by examiner

APPARATUS AND METHOD FOR SHIELDING PRINTED CIRCUIT BOARDS

BACKGROUND OF THE INVENTION

Field of the Invention

The present invention generally relates to an apparatus and method for shielding printed circuit boards. More specifically, a shielding arrangement is provided comprising a cover for shielding a selected portion of the printed circuit board and a sidewall insert molded about the edge of the cover, wherein the sidewall includes a first and second ledge for supporting the edge of the cover therebetween.

Electronic devices, such as communication devices, include printed circuit boards which emit electromagnetic waves. These electromagnetic waves generate noise or unwanted signals which interfere with the functionality of other electrical components and devices in the vicinity. Accordingly, printed circuit boards are shielded to eliminate electromagnetic interference.

A number of shielding arrangements have been designed to shield printed circuit boards. For example, U.S. Pat. Nos. 6,501,016 and 6,136,131 describe a shielding enclosure having a plurality of side walls and an integral top surface, the top surface including a scored line for allowing removal of an interior portion of the top surface. U.S. Pat. No. 6,180,876 describes an apparatus and method for shielding discrete areas of a printed circuit board from electromagnetic interference having a frame and separate shielding lids. U.S. Pat. No. 6,169,666 describes a shielding screen having a frame which is adhesively fastened to a cover. U.S. Pat. No. 6,051,779 describes an RF shielding device having sidewalls defining a number of guide tabs thereon enabling the shielding apparatus to be inserted within a molding apparatus such that an electrically conductive gasket may be molded directly to the sidewalls of the shielding apparatus. Each of the patents identified herein is incorporated by reference hereinto.

In a trend toward creating smaller electronic devices, it is desirable to create electronic components for such devices which are smaller as well. Nevertheless, prior shielding arrangements, such as those described above, have generally remained large relative to the smaller electronic devices. More specifically, prior shielding arrangements such as so-called shield cans generally include a mechanical engagement wherein a cover is mounted on top of a shield can frame or by the inner surfaces of the side walls of the frame. These engagements are deficient in that they require and consume valuable space.

Therefore, it is an aspect and object of this invention to provide a shielding arrangement which avoids one or more of the drawbacks of prior shielding arrangements.

Another aspect or object of the present invention is the solution of the problem of compressing shield can sizing for added compaction of components for printed circuit boards and other electric items which can benefit from enhanced miniaturization.

SUMMARY OF THE INVENTION

In view of the desired goals of the invention claimed herein, a shielding apparatus for a portion of a printed circuit board is provided including a cover for shielding a selected portion of the printed circuit board. The cover has an edge, and a sidewall is molded about the edge of the cover. This sidewall includes a first and second ledge for supporting the edge of the cover therebetween and is arranged to define a selected portion of a periphery of the shielding apparatus for a portion of the printed circuit board to be shielded.

In one embodiment, the sidewall defines a frame. In another embodiment, the cover is integral with the sidewall. In yet another embodiment, the shielding apparatus further includes an inner wall extending from a first segment of the sidewall to a second segment of the sidewall for defining a discrete area of the printed circuit being shielded. Also, the cover may include apertures along the abutment with the inner wall for improving the bond between the cover and the inner wall.

In accordance with yet another aspect of the present invention, a method for shielding a portion of a printed circuit board is provided including providing a cover for shielding a portion of a printed circuit board. The cover includes an edge whereupon a sidewall is molded about the edge of the cover such that the sidewall comprises a first and second ledge for insert molding the edge of the cover therebetween.

An inner wall may further be molded extending from a first segment of the sidewall to a second segment of the sidewall to define a discrete area of the printed circuit board being shielded by said cover. Also, apertures may be defined in the cover along the abutment with the inner wall for improving flow.

It should be understood that the present invention includes a number of different aspects or features which may have utility alone and/or in combination with other aspects or features. Accordingly, this summary is not exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed. Other aspects, objects and advantages of the present invention will be understood from the following description according to the preferred embodiments of the present invention, specifically including stated and unstated combinations of the various features which are described herein, relevant information concerning which is shown in the accompanying drawings.

BRIEF DESCRIPTION OF THE DRAWINGS

Throughout this description, reference has been and will be made to the accompanying views of the drawing wherein like subject matter has like reference numerals, and wherein.

DESCRIPTION OF THE PREFERRED EMBODIMENTS

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
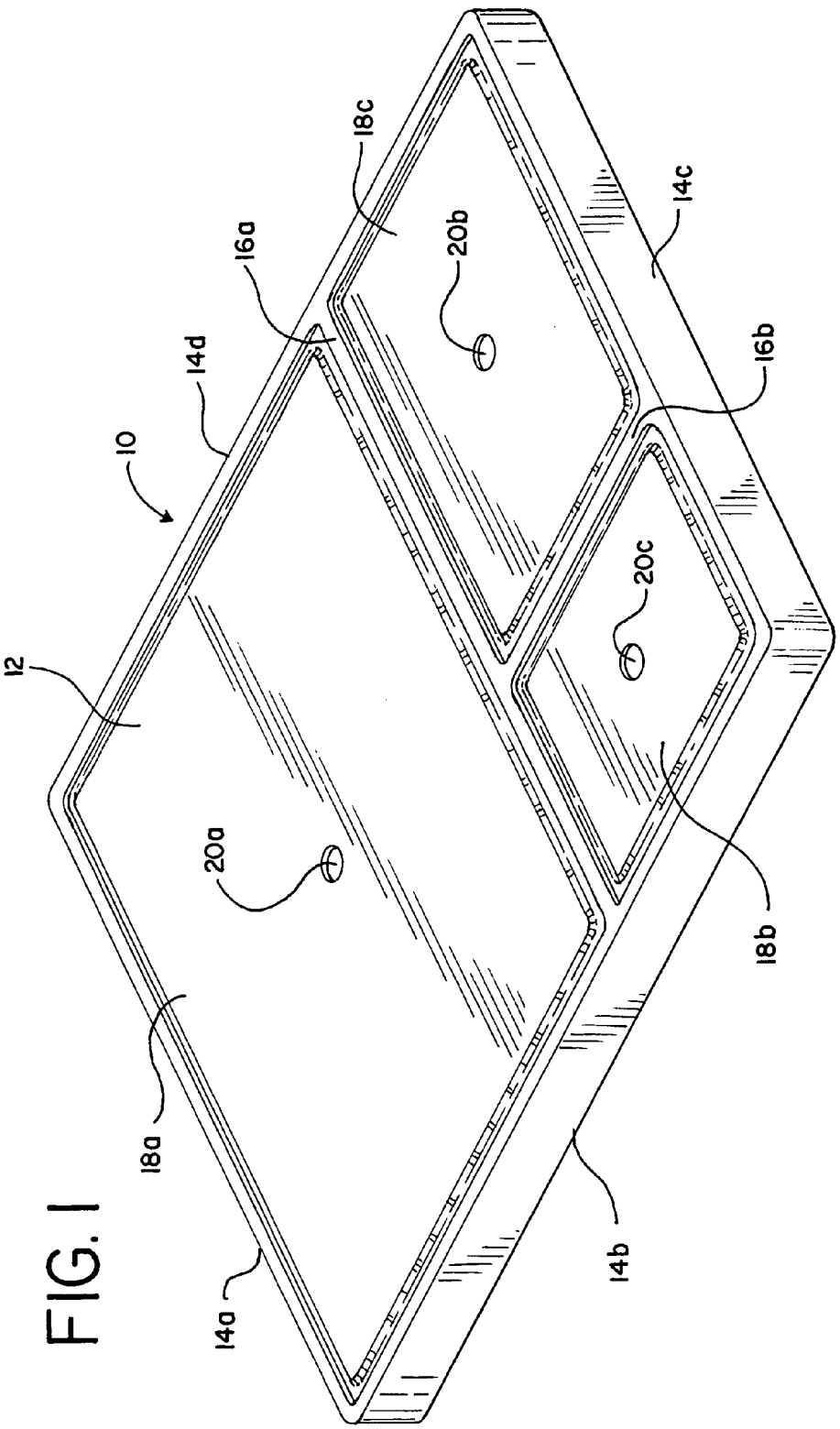
FIG. 1 is a perspective view showing the shielding apparatus in accordance with an embodiment of the present invention.

Referring to FIG. 1, a shielding apparatus for a portion of a printed circuit board is shown generally by reference numeral 10. The shielding apparatus 10 may be affixed to a selected portion of or entire printed circuit board for shielding electromagnetic waves from interfering with other electrical components. Such methods for affixing the shielding apparatus 10 to the printed circuit board are generally known in the art and include soldering, welding, bonding, gluing, mechanical affixation means, or other suitable affixation means.

The shielding apparatus 10 of the embodiment illustrated FIG. 1 generally comprises a cover 12 and sidewall 14 for supporting the cover 12. In this embodiment, the sidewall 14 includes four segments, 14a,b,c,d, which form a frame defining the periphery of the selected portion of the printed circuit board being shielded. It is important to note, however, that it is not required that the sidewall includes four segments to form a frame or define a generally rectangular shaped area being shielded. For example, the sidewall may only comprise three segments defining a rectangular shaped area being shielded wherein one side is left open. Alternatively, the three segments may further define a triangular shaped area being shielded. In another example, there may be only one segment which defines a circular area being shielded. A perimeter shape and number of segments can be chosen as needed or appropriate for a particular device in need of shielding.

The shielding apparatus 10 of the embodiment shown in FIG. 1 further includes a first inner wall 16a extending from a first segment of the sidewall 14b to a second segment of the sidewall 14d. A second inner wall 16b is further provided extending from the first inner wall 16a to a third segment of the sidewall 14c. This first inner wall 16a and second inner wall 16b define discrete areas of the selected portion of the printed circuit board being shielded. More specifically, discrete compartments 18a,b,c are formed wherein individual components or areas of the circuit board may be shielded from one another.

The cover 12 of the shielding apparatus 10 of the embodiment shown in FIG. 1 further includes vents 20a,b,c for dispersing heat produced by the circuit board. In this case, three vents 20a,b,c are provided for dispersing the heat emitted by the three individual components or areas of the printed circuit board. It is important to note that the vents may be of any shape or size dependent on the area or component being shielded by the shielding apparatus.

Figure 2:
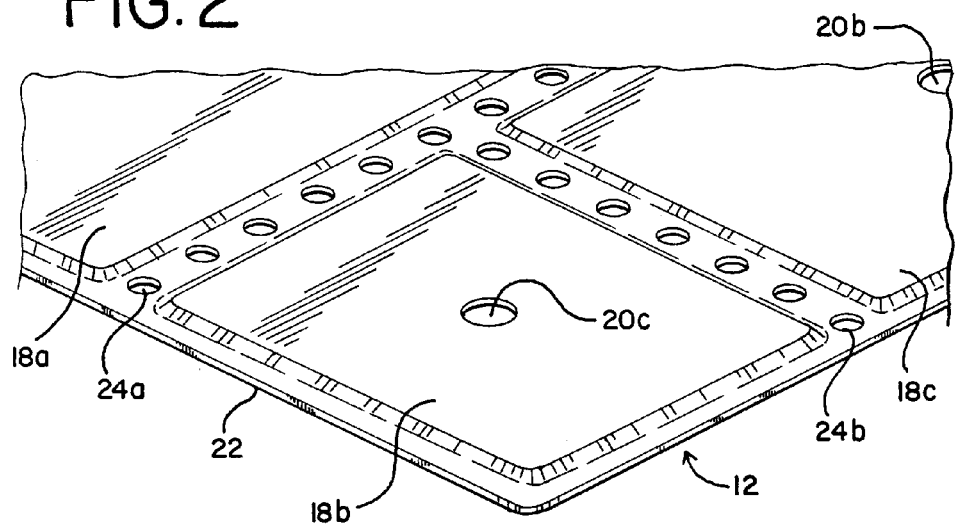
FIG. 2 is a perspective view of a portion of the cover of the shielding apparatus in accordance with an embodiment of the present invention.

Now turning to FIG. 2, the cover 12 of FIG. 1 is shown as being integral. The cover includes an edge 22 which defines the periphery of the selected portion of the printed circuit board being shielded. The cover 12 is preferably formed from a metallic material which reduces electromagnetic waves, such as tin. It is important to note that other metallic materials may also be used in forming the cover 12 such as a tin plated metal, copper, alloys, or any other electromagnetic reducing material. The cover 12 is further stamped to define the three compartments 18a,b,c as shown in FIG. 1. It is important to note that the cover may be stamped to form the desired shape and area being shielded. For example, the cover may be stamped more deeply than shown to provide a higher "ceiling" to accommodate taller components.

The cover 12 further comprises a plurality of apertures 24a,b along the abutment of the cover 12 with the inner walls 16a,b. In this case, now referring to both FIGS. 1 and 2, the apertures shown at 24a are formed along the abutment of the cover 12 with the first inner wall 16a, whereas the apertures shown at 24b are formed along the abutment of the cover 12 with the second inner wall 16b. The apertures 24a,b allow for a stronger mechanical bond between the cover 12 and the inner walls 16a,b as will be explained in greater detail below.

Figure 3:
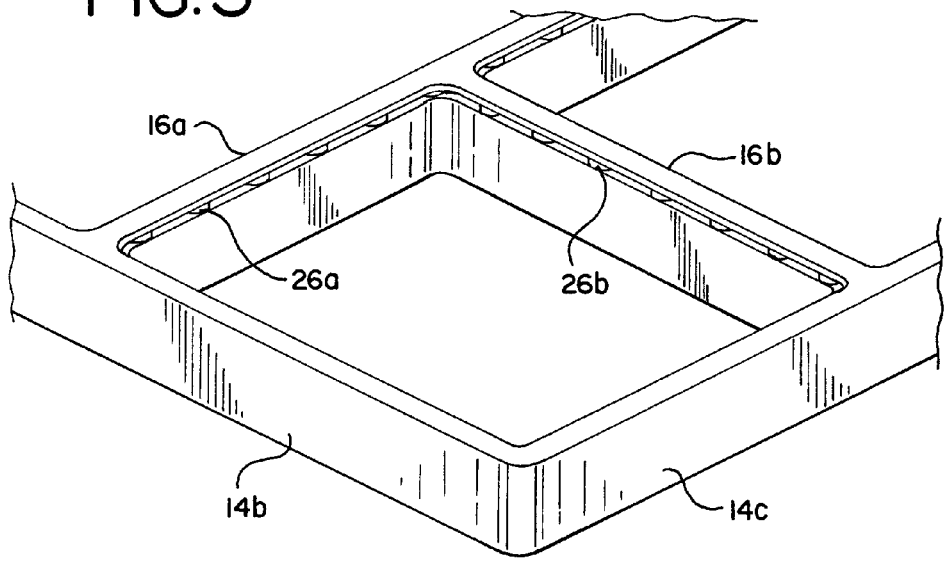
FIG. 3 is a perspective view of a portion of the sidewall and inner wall arrangement in accordance with an embodiment of the present invention.

Now turning to FIG. 3, the segments 14b,c of the sidewall of FIG. 1 are shown as being integral. The segments 14a,d of the sidewall are not shown in this FIG. The segments 14b,c of the sidewall define the periphery of the selected portion of the printed circuit board being shielded. The sidewall 14 is preferably formed of a moldable polymer or plastic. It is further preferable that the polymer is a high temperature plastic such as a liquid crystal polymer or LCP. Using an LCP or other high melting point polymer has the advantage of readily accommodating reflow soldering to the printed circuit board. Moreover, the plastic sidewalls may be plated with a metallic layer or multiple layers to provide electromagnetic shielding (i.e. a tin, copper, alloys, or any other electromagnetic reducing material plating). Plating of one or more electromagnetic materials typically will be carried out by electroless plating techniques generally known in the art.

The inner walls 16a,b are further shown which define discrete areas of the selected portion of the printed circuit board being shielded. These inner walls 16a,b are further shown being integral with the sidewall 14. These inner walls 16a,b may further be constructed of the same material as the sidewall 14 and plated with the same material to achieve electromagnetic shielding.

The inner walls 16a,b are further shown to have a plurality of columns 26a,b corresponding with the apertures 24a,b along the abutment of the cover 12. In this case, now referring to both FIGS. 2 and 3, the columns 26a,b engage with the apertures 24a,b to allow for a stronger mechanical bond between the cover 12 and the inner walls 16a,b. This engagement between the column 26b and aperture 24b is shown in greater detail in FIG. 4.

Figures 4, 5:
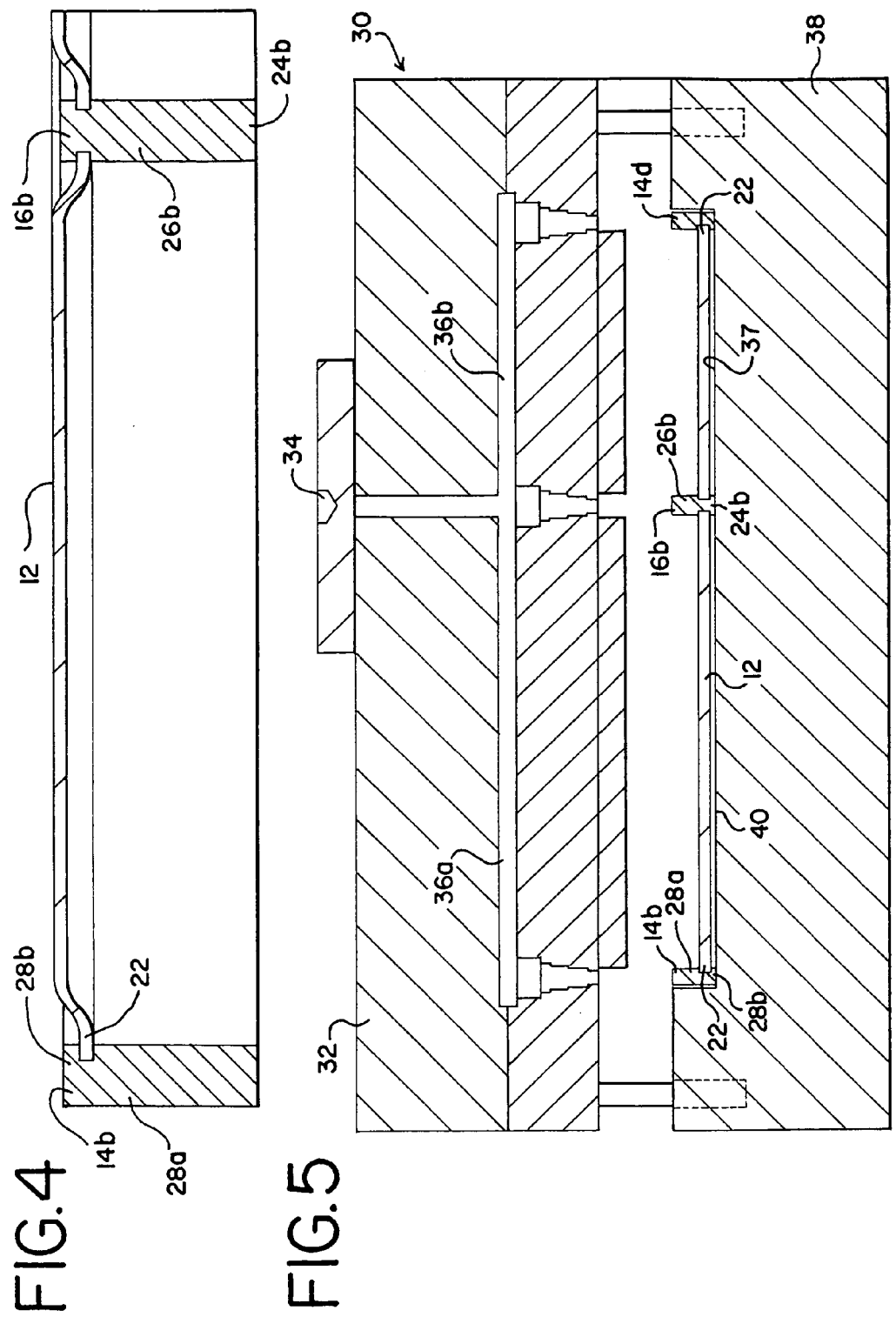
FIG. 4 is a cross-sectional view of the cover-sidewall and cover-inner wall engagements in accordance with an embodiment of the present invention.
FIG. 5 is a cross-sectional view of the insert molding process in accordance with an embodiment of the present invention.

FIG. 4 further illustrates the engagement between a segment 14b of the sidewall and the edge 22 of the cover 12. In this arrangement, the segment 14b of the sidewall comprises a first ledge 28a and a second ledge 28b, wherein the first and second ledge 28a,b support the edge 22 of the cover 12 therebetween. The same arrangement is similar for the other segments 14a,c,d of the sidewall.

Now referring to FIG. 5, an insert molding process for constructing the shielding apparatus 10 of the claimed invention is shown. The mold, generally designated at 30, includes a top plate 32 having a sprue 34 and runners 36a,b. This top plate 32 fits onto a complementary bottom cavity 37 of a mold plate 38. During the insert molding process, the cover 12 is placed in the bottom cavity 37 of the mold plate 38 such that the support plate 40 securely engages the cover 12. A plastic resin is injected from the sprue 34 into the channels formed by the engagement of the top plate 32 and the bottom cavity 37. Multiple runners 36a,36b are provided to ensure a fast and even flow of resin. The cover 12 further comprises an aperture 24a as shown in FIG. 2 which aids in the flow of plastic resin. The resin cures thereby forming the shielding apparatus as shown in FIGS. 1–4.

While this invention has been described with reference to certain illustrative aspects and embodiments, it will be understood that this description shall not be construed in a limiting sense. Rather, various changes and modifications may be made to the illustrated embodiments and aspects by those skilled in the art without departing from the true spirit and scope of the invention, including those combinations of features that are individually disclosed or claimed herein.

The invention claimed is:

1. A shielding apparatus for shielding at least a portion of a printed circuit board, comprising:
   a cover for shielding a selected portion of the printed circuit board, said cover having an edge;
   a frame including a sidewall molded about the edge of the cover, said sidewall comprising a first and second ledge for supporting the edge of said cover therebetween, the sidewall being arranged to define a selected portion of a periphery of a shielding apparatus for shielding a portion of a circuit board being shielded;
   a first inner wall extending from a first segment of the sidewall to a second segment of the sidewall for defining discrete areas of the printed circuit board being shielded; and
   wherein the cover is uniformly solid along the abutment with the sidewall and includes apertures along the abutment with the inner wall.

2. The shielding apparatus of claim 1 wherein the cover is integral with the sidewall.

3. The shielding apparatus of claim 1 further comprising a second inner wall extending from the first inner wall to a segment of the sidewall for defining discrete areas of the printed circuit board being shielded.

4. The shielding apparatus of claim 1 wherein the cover includes a vent.

5. The shielding apparatus of claim 1 wherein the edge of said cover is insert molded between the first and second ledge.

6. A method for shielding a portion of a printed circuit board, said method comprising:
   providing a cover for shielding a portion of a printed circuit board, the cover having an edge;
   maintaining the edge of the cover uniformly solid while defining apertures in areas other than the edge of the cover for defining discrete areas of the printed circuit board being shielded;
   molding a frame having a sidewall about the edge of the cover such that the sidewall comprises a first and second ledge for insert molding the edge of the cover therebetween; and
   molding an inner wall extending from a first segment of the sidewall to a second segment of the sidewall for defining discrete areas of the printed circuit board being shielded, wherein the apertures in the cover along the abutment with the inner wall improve flow during the insert molding process.

7. The method for shielding a portion of a printed circuit board of claim 6, further comprising providing a second inner wall extending from the first inner wall to a segment of the sidewall for defining discrete areas of the printed circuit board being shielded.

8. A shielding apparatus for shielding at least a portion of a printed circuit board, comprising:
   a cover for shielding a selected portion of the printed circuit board, said cover having an edge;
   a frame molded about the edge of the cover, said frame comprising a first and second ledge for supporting the edge of said cover therebetween, the frame being arranged to define a selected portion of a periphery of a shielding apparatus for shielding a portion of a circuit board being shielded;
   a first inner wall extending from a first segment of the sidewall to a second segment of the sidewall for defining discrete areas of the printed circuit board being shielded; and
   wherein the cover is uniformly solid along the abutment with the sidewall and includes apertures along the abutment with the inner wall.

9. The shielding apparatus of claim 8 wherein the cover is integral with the frame.

10. The shielding apparatus of claim 8 further comprising a second inner wall extending from the first inner wall to a segment of the frame for defining discrete areas of the printed circuit board being shielded.

11. The shielding apparatus of claim 8 wherein the cover includes a vent.

12. The shielding apparatus of claim 8 wherein the edge of said cover is insert molded between the first and second ledge.

* * * * *